(12) United States Patent
Lopez et al.

(10) Patent No.: US 8,435,349 B2
(45) Date of Patent: May 7, 2013

(54) EPITAXIAL REACTOR FOR MASS PRODUCTION OF WAFERS

(75) Inventors: Antonio Luque Lopez, Madrid (ES); Juan Carlos Zamorano Saavedra, Madrid (ES); Ignacio Tobias Galicia, Madrid (ES); Hugo-Jose Rodriguez San Segundo, Madrid (ES)

(73) Assignee: Universidad Politecnica de Madrid, Madrid (ES)

( * ) Notice: Subject to any disclaimer, the term of this patent is extended or adjusted under 35 U.S.C. 154(b) by 1062 days.

(21) Appl. No.: 11/921,950

(22) PCT Filed: Jun. 15, 2006

(86) PCT No.: PCT/ES2006/000351
§ 371 (c)(1),
(2), (4) Date: Apr. 10, 2009

(87) PCT Pub. No.: WO2006/134194
PCT Pub. Date: Dec. 21, 2006

(65) Prior Publication Data
US 2009/0217877 A1    Sep. 3, 2009

(30) Foreign Application Priority Data
Jun. 16, 2005 (ES) .................................. 200501461

(51) Int. Cl.
*C23C 16/00* (2006.01)
(52) U.S. Cl. .................. 118/719; 118/728; 118/500
(58) Field of Classification Search .................. None
See application file for complete search history.

(56) References Cited

U.S. PATENT DOCUMENTS

| 3,460,510 A | 8/1969 | Currin |
| 4,694,779 A | 9/1987 | Hammond et al. |
| 5,921,257 A | 7/1999 | Weber et al. |

FOREIGN PATENT DOCUMENTS

| ES | 2 011 105 | 12/1989 |
| JP | 5-98449 | 4/1993 |

OTHER PUBLICATIONS

Noda, S. et al. Closed recycle CVD process for mass production of SOG-Si from MG-Si, 2002, IEEE, pp. 308-311.*

* cited by examiner

*Primary Examiner* — Robert Xu
(74) *Attorney, Agent, or Firm* — Clark & Brody

(57) ABSTRACT

A high throughput reactor for the mass production of wafers through chemical vapor deposition, mainly to form silicon epitaxies for the photovoltaic industry, is described. Main innovation is a high susceptor stacking density: several graphite susceptors are placed vertically and parallel to one another, electrically interconnected, and are heated by Joule effect. Electrical current gets to the susceptors from the current source through specially designed feedthroughs, which connect the cold room outside the deposition chamber with the hot susceptors. Gas flows vertically between susceptors. The substrates on which deposition occurs are placed on the susceptors. Below the susceptors a pre-chamber is found, in which entering gas calms down and distributes homogeneously. Susceptors and pre-chamber are placed inside a stainless steel chamber, which is internally covered by a reflecting material, and externally kept cold by water. Both susceptors and pre-chamber are fixed to a connection panel, which also contains electrical feedthroughs, thermocouple feedthroughs, and gas inlet and outlet. Outlet gases are partially recycled, with the corresponding gas savings and increased deposition efficiency.

4 Claims, 5 Drawing Sheets

EPITAXIAL REACTOR FOR MASS PRODUCTION OF WAFERS

TECHNICAL SECTOR

The present invention is framed in the sector of chemical vapor deposition growth processes, more concretely epitaxial growth processes, within microelectronic and photovoltaic industry.

STATE OF THE ART

Silicon epitaxial growth by chemical vapor deposition is a widely known and applied process in microelectronics. It consists on the formation of a crystalline material thin film (around 20-50 µm) on a thick crystalline substrate (around 300 µm) in such a way that the atoms in the epitaxial layer reproduce the crystallographic structure of the substrate. This is achieved by flowing a silicon containing gas (a chlorosilane, for instance), called source gas, diluted in a so called carrier gas, over the substrate where growth is wanted. This substrate is heated up to the temperature at which source gas pyrolisis and consequent atomic silicon deposition take place. Epitaxial reactors are working in industry and laboratories since the 1970's, and even before. There exist several reactor configurations: horizontal, vertical, barrel, rotating disc, etc. All of them provide good epitaxy quality.

However, no silicon epitaxy process in a mass production scale has been developed up to date. Industrial reactors may be sufficient for the microelectronic industry, where thousands of microchips can be obtained by processing one single semiconductor wafer, thus being the current reactor throughput enough for their purposes.

Photovoltaic industry, however, cannot make any profit of the current epitaxial process, because only one solar cell can be obtained from one processed wafer, their throughput being thus much smaller. Current solar cells are fabricated on thick crystalline silicon semiconductor wafers, with no epitaxy, that have gone through very expensive purification and crystallization steps, such as Siemens and Czochralski processes. This implies, on one hand, a very expensive raw material, and, on the other hand, a very strong dependence on the fluctuations and prices of the microelectronic market. There is currently a shortage of silicon as raw material for photovoltaics, very much complicating its harmonic development.

The advantage in using an epitaxial reactor is that it allows fabricating the solar cell in a thin silicon epitaxial layer of high purity, grown on a silicon substrate of much lower quality. In order to achieve that, it is necessary to develop a high-throughput epitaxial reactor, able to produce epitaxied silicon semiconductor layers in a big scale, for instance 250 to 1000 wafers per process, for the photovoltaic industry. There are currently several alternatives being researched. For instance, the Fraunhofer ISE Institute in Freiburg, Germany, has developed a continuous epitaxial reactor, in which substrates continuously pass through the epitaxial chamber carried on bands.

The solution adopted by the present invention, based on the previous patent ES 2 011 115, consists of an epitaxial reactor where substrates are very densely stacked, separated around 4 cm from one another, in a way that many substrates can be processed at the same time in a big chamber. To that effect, induction or infrared lamp heating is substituted by Joule effect, which allows the desired stacking density for the invention's configuration, and is also very efficient in energy use. Besides, the present invention incorporates recycling of usually more than 90% of the used gas, providing big savings in gas costs, especially in carrier gas. All of this can contribute to cost reduction in solar cell production. The microelectronic industry can also benefit from all or at least some of the aspects of the present invention.

DESCRIPTION

The present invention is a reactor for chemical vapor deposition, mainly intended for the epitaxial deposition of silicon for electronic or photovoltaic devices. In this case, silane as well as chlorosilanes can be used as silicon source gases which are carried to the deposition surface in a carrier gas flow (hydrogen, nitrogen, argon, etc). The gas mixture enters the sealed chamber directly into the pre-chamber, flows through it upwards, then flows between the susceptors and exits the chamber by a gas outlet pipe, helped by the chamber's upper wall tilting towards that outlet. See rest of document for the explanation of each single part mentioned above.

In this reactor, the substrates or conductive wafers where the epitaxial layer is to be deposited are placed on densely stacked graphite (or other conductive material) susceptors. This allows a large number of samples to be processed per batch, between 250 and 1000, so that the throughput is very much increased with respect to the commercial reactors used for those purposes. This way, the time employed in heating and cooling becomes very small in a per substrate basis thus significantly reducing the amortization costs. Another characteristic of the proposed design, also leading to reduced deposition costs, is the efficient heating system employed.

In a preferred but not exclusive configuration, the reactor chamber is shown in FIGS. 1 and 2. The chamber connection panel (1) is fixed and allocates all sensitive parts of the reactor, such as the electrical (7) and gas (5 and 6) connections, and other feedthroughs needed for instrumentation and control (8). The susceptors are vertically placed, electrically interconnected by parts of the same conductive material (4). For their mechanical support, besides being attached to the panel at their ends, they can rest on columns of an isolating material. The gas is first introduced into a pre-chamber (3), which is either welded or simply attached to the panel (1), where it is mixed and evenly distributed in the spaces between susceptors. The rest of the chamber walls form a housing (2) that moves to open and close the chamber.

Thus, a high throughput process is obtained by the present invention, which is a reactor where susceptors are densely stacked, separated some 4 cm from one another, allowing a high number of semiconductor wafers (which are the epitaxy substrates) per run, from 250 to 1000. As shown in FIG. 3, these susceptors (4) are rectangular plates of conductive material placed vertically in front of each other (parallel). They are series connected with additional parts (9) of the same conductive material, which allows the whole conductive block to conduct electricity, acting as a resistance which is easily heated to the adequate deposition temperature by Joule effect when an electrical current flows. This heating method is not conventionally used in commercial epitaxial reactors, which use either induction heating by induction coils, or infrared heating by lamps. Joule effect is a much more efficient heating method. Energy efficiency is also assisted by the fact that hot susceptors radiate to the neighbouring ones and by the high reflectance of the walls, so that most of the radiation is kept inside the reaction chamber.

Susceptors have a slightly trapezoidal section, i.e., they are slightly tilted, with a broader base and a thinner upper side. The substrates lie on both sides of the susceptors, held by specially designed holders, so that they do not fall down. Gas flows upwards along the interspaces between susceptors (which will be called interducts (10) in the present document), and deposition takes place on the hot substrates. These interducts (10) are thus the real "reaction chambers", i.e., the space to be considered for all calculations regarding deposition. In most epitaxial reactors gas flows between a hot susceptor and a relatively cold wall (reason why they are called "cold-wall" reactors), whereas along the interducts (10) of the present invention, the gas flows between two hot susceptors (so that it is a "hot-wall" reactor). Among others, the main thermodynamic effect of this configuration is that the gas temperature rises much faster than in cold-wall reactors, which is undesirable, because hot gases could lead to homogeneous nucleation reactions in the gas phase and lower epitaxy quality, especially when using low-chlorinated or non-chlorinated silicon source gases such as dichlorosilane or silane.

There are several ways of avoiding an excessive heating of the gas. One of them is using a carrier gas with a lower heat diffusivity coefficient, such as nitrogen instead of the commonly used hydrogen. The problem is that the diffusion coefficient of the silicon source species is much lower in nitrogen than in hydrogen. This effect can be minimized by working at lower pressures, around 250 mbar, where the diffusion of source species is faster. Working at reduced pressure can make the system more complex. Another way of avoiding excessive heating of the gas, not incompatible with the previous one, is to increase the gas flow. This is the option taken in the present invention. The main drawback of increasing gas flow is obvious: the gas consumption rises to values where growth might not be economically feasible any longer. This problem is solved here by a simple idea, but at the same time rather innovative in epitaxial reactors: to recirculate most of the outlet gas back again into the reaction chamber. Thus only a small fraction of the gas is vented out, exactly the same fraction of fresh gas which is fed in. That way, gas consumption is drastically reduced, in approximately a 90%.

The reactor of the present invention is constituted by a sealed chamber externally water cooled, and internally covered by reflecting material, that is assembled to a gas recirculation system and that contains: a pre-chamber, a variable number of stacked, vertical, parallel to one another susceptors, heated by Joule effect; semiconductor wafers placed on the susceptors and held to them by holders of the susceptors' same material; a fixed connection panel, where electrical and thermocouple connections, and gas inlet and outlet are found, which is attached to the pre-chamber by welding, screwing or similar; and a housing that slides on rails, which opens and closes the chamber by uncoupling from or coupling to the connection panel.

The reactor is composed by a chamber, made of stainless steel or other metallic material, which is internally covered by a reflective material, thus reflecting back most (around 85%) of the radiation produced by the hot susceptors, and externally cooled by water. The reflective layer avoids excessive heating of the chamber walls, which brings about further advantages: energetic losses are reduced, therefore a lower water flow is needed for refrigeration, inexpensive materials can be used for joints, etc, since they do not have to stand high temperatures, there is no need for an otherwise expensive quartz chamber, etc. The quartz chamber can be provided if wanted for contamination reduction of the semiconductive wafers, but is not necessary for other purposes.

The radiation between hot neighbouring susceptors is, on the other hand, the main factor that helps keep susceptor temperature very homogeneous along its surface. This is a key factor for a homogeneous deposition and crystal growth, and therefore good epitaxy quality. In fact, it is this same temperature homogeneity requirement the one that sets a limit to the stacking density of the susceptors, for, if these are placed very close to each other, homogeneity is lost.

The susceptors also feature cylindrical, vertical holes to accommodate thermocouples for temperature measurement and control purposes.

As has been stated above, heating of the susceptors occurs via Joule effect by passing an electrical current through them. Temperatures above 1000° C. can be achieved. This implies that very hot parts need to be connected to the electrical power supply outside the chamber. The present invention includes a simple system for electrical feedthroughs, which connects the cold outer wall with the hot susceptors, with a temperature difference of around 1000° C. It can be seen in FIG. 4. The idea is to provide a prolongation (12) of the susceptor (4) where electrical connections are needed. This prolongation (12) is enclosed in an extra stainless-steel chamber (7) protruding from the connection panel, as explained later. There will be no reflective covering inside this extra chamber, and the inner stainless-steel walls (13) will be, on the contrary, radiation absorbent and externally provided with extra water cooling (14). That way the susceptor prolongation (22) will loose its heat rapidly by radiation, and, at its colder end, will have low enough temperature to allow safe connection to the inner part (11) of a conventional current feedthrough, i.e., some 400° C. or below. This conventional feedthrough can then traverse the wall to the outer electrical connections, without risk of a contact at high temperatures. The chamber extensions (7) which allocate the feedthroughs are provided not only with external water cooling (14), but also with thermocouple feedthroughs and other opening points to easily access inside.

An interesting piece of design in the present invention is the connection panel, schematically represented in FIG. 5. The panel is the only fixed part of the chamber, being the rest of it an open box or housing consisting of the walls. This box can move, and slides on bars to open and close the chamber. This way, the connection panel itself is fixed and can allocate gas inlet (5) and outlet (6), electrical feedthroughs (7), and thermocouple or other purpose feedthroughs (8), and it also mechanically supports the pre-chamber (see FIGS. 6, 7 and 10), which is welded to it, and the susceptors (see FIGS. 3 and 10), which are connected to the panel via the electrical feedthroughs. Thus, a single, non-movable block consisting of panel, susceptors and pre-chamber is formed and the reactor's most sensitive parts are fixed, they do not move. The risks associated to the movement of delicate parts when opening and closing or manipulating are thus avoided.

Gas inlet (5) is situated, together with thermocouple and other feedthroughs (8), in the lower part of the connection panel. Chamber extensions for the electrical feedthroughs (7) are situated just above them. The upper part of the connection panel has a chimney-like extension (6) which facilitates the gas exiting the chamber. Additionally, the upper side of the movable reactor walls is tilted towards the panel, to avoid gas flow disruption and further helping gas outlet (see FIG. 1).

The connection panel is provided with a vacuum joint system and appropriate closure mechanisms. It can allocate two concentric joints. Having two joints instead of one is an additional safety and precaution measure to avoid gas leaks through the connection panel. The inner one seals the chamber when this is closed, and the outer one acts as a further safety sealing. Between both joints vacuum is made, and pressure strictly controlled by a pressure control system coupled to the space between joints. An increase in pressure would mean that a leak is produced in the inner or the outer seal. If this occurs, the control system must stop the process immediately. This vacuum should be enough to ensure that the vacuum chamber is properly closed, but additional clasps are provided to mechanically attach the connection panel to the rest of the chamber when the reactor is closed.

A further crucial part of the novel reactor design is the so called pre-chamber, depicted in FIGS. 6 and 7. It is a stainless steel chamber placed inside the reactor chamber and below the susceptors. It has three main functions:

a) Provide mechanical support to the susceptor structure, which otherwise would only be held by the electrical connections on the connection panel as explained above. To hold the susceptors, the pre-chamber is provided with hollow stainless steel columns (16) situated under each susceptor. A ceramic hollow tube (17) is place inside each column. The ceramic tubes are some centimeters longer than the stainless steel columns, so that the susceptors can lie on them without touching the pre-chamber. The columns (16) also provide the pre-chamber with a rigidity that avoids deformation.

b) Distribute the entering gas and eliminate turbulences. The chamber is split into two parts, separated by a gas distributor (19). The lower part (18) receives the inlet gas (5), which expands. Then it flows upwards through the gas distributor (19) that consists of a perforated plate, to the upper part of the chamber (20). The gas distributor helps keep the gas flow in a laminar regime and distribute it homogeneously along the whole susceptor area. Above the gas distributor (19), the upper wall (21) of the pre-chamber is only open to the interducts (22), so that gas flows directly where it is needed. This upper wall (21) of the pre-chamber will either be of a reflective material, or incorporate a reflective system such as the reactor walls do, in order to reflect most of the radiation received from the susceptors above.

c) As mentioned before, the susceptors can present cylindrical, vertical holes where thermocouples can be placed for instrumentation and control purposes. The encapsulated thermocouple wires run inside ceramic columns (16) and are led into the lower chamber (23), called the thermocouple chamber, through properly sealed fixtures (24). There the wires are collected and driven to the feedthroughs on the connection panel (8), while keeping them away from the corrosive atmosphere inside the rest of the chamber. The thermocouple chamber (23) is isolated from the rest of the pre-chamber and of the reactor chamber. It is kept in an inert atmosphere of nitrogen which is supplied also through the connection panel. That way wires are not affected by the corrosive HCl and other substances that may be present in the reactor's atmosphere.

As already mentioned above, a recirculation of the outlet gases is needed in order to save gas consumption, making the process economically viable. In a first, simple approach to the recirculation system of the present invention, represented in FIG. 8, the hot gas exits the reactor (25) to enter directly into a heat exchanger (26), where it is cooled down to near room temperature. After the heat exchanger (26), the flow splits, and part of the gas is vented out by means of an extraction pump (27) and flows through a neutralizer (28), whereas most of it is recirculated back into the reaction chamber (25) by means of a gas blower (29). When lowering the temperatures in the heat exchanger (26), the species in the recirculated stream can react so that the gas composition changes, and this has to be taken into account when mixing the recirculated stream with the fresh stream (30) before entering the reaction chamber (25) again. If a chlorinated silicon source is used, the hydrogen chloride concentration increases as a side product of the deposition: there is a maximum that should not be exceeded, otherwise etching of the silicon surface starts being more important than the growth itself. These considerations determine the fraction of gas that can be recirculated. In most cases the hydrogen chloride concentration is kept tolerable while over a 90% of the output gas stream can be fed back into the reactor, which implies big savings especially in carrier gas. These limitations do not apply when silane is the source gas. In addition, recirculation can in some cases increase the efficiency of the deposition by reusing the remaining source gas.

A second version of the recirculation implies in-situ formation of the source gas, and is represented in FIG. 9. In this case, the starting material for the deposition is not a silicon-containing gas, but solid silicon, which can be ultrapure silicon, or for instance metallurgical grade silicon (mg-Si), or upgraded metallurgical grade silicon (umg-Si), both of them cheaper.

With an initial feed of hydrogen and HCl (32), this silicon reacts to form a mixture of chlorosilanes, whose composition depends on the conditions used. The desired species in the appropriate concentration is thus obtained. After being cooled down in a heat exchanger (33), it can be fed into the reaction chamber (25), where deposition by heating of the gas takes place, as explained above. The hot gases, rich in HCl again, exit the chamber (25) and are cooled down the same way as before, by means of another heat exchanger (26), but only to the exact temperature at which etching of the silicon is desired. They are then fed into the etching chamber (31) which contains the source silicon, and formation of source gases takes place again, with consumption of HCl and hydrogen. The system is then a closed loop, where the only inlet material is source silicon (apart from the initial HCl and hydrogen (32)), and the only product is epitaxial silicon. This interesting concept implies theoretical deposition efficiencies of 100% and theoretical carrier gas consumption of zero.

This gas recirculation system includes in situ formation of source gas by HCl etching of solid silicon, and includes a heat exchanger at the deposition chamber exit, a solid silicon etching chamber, another heat exchanger at the exit of this etching chamber, and initial gas feed.

In the case of non-ultrapure source silicon some purification steps are needed, which are not the object of the present invention but are supposed to be included schematically in the chamber (31).

Finally, a general vision of the ensemble of the reactor chamber and its inside can be appreciated in FIG. 10. In it, the fixed connection panel (1) is attached to both pre-chamber (2) and susceptors (4). The chamber walls (2), which form the rest of the housing, slide on rails to open and close the chamber.

MODE OF REALIZATION OF THE INVENTION

Figure 1:
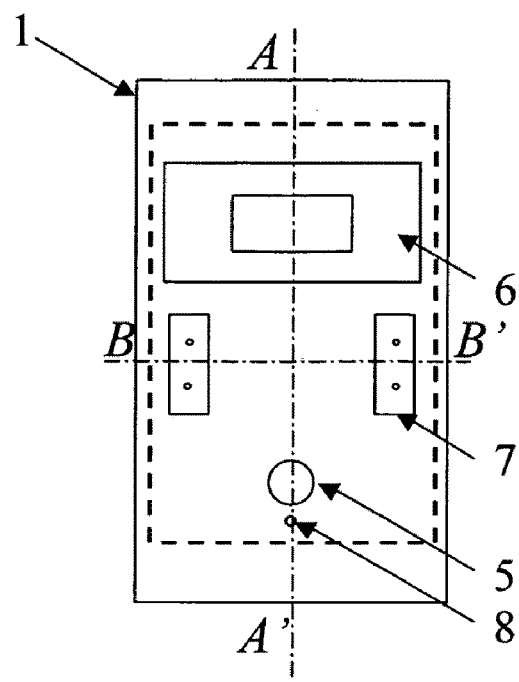
FIG. 1. Front view of the complete reactor. The door (1) and the chamber walls (2) form the sealed reactor chamber. Inside, and attached to the door (1), the pre-chamber (3) and the susceptors (4) are found. The door (1) allocates the gas inlet (5), the chimney-like gas outlet (6), the housing (7) for the specific design of the electrical feedthroughs and also feedthroughs for thermocouple wires (8).
Figure 2:
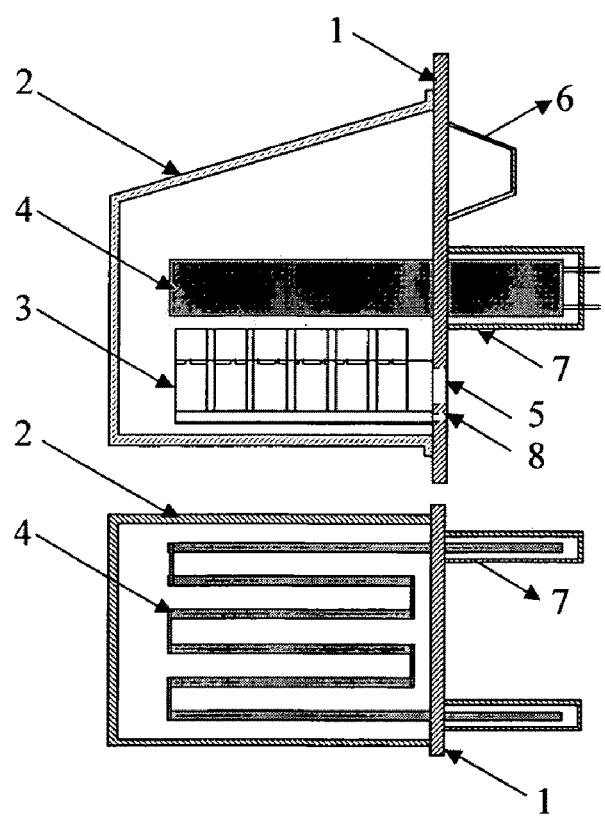
FIG. 2. Cross section drawings through line AA' (above) and BB' (below), according to lines AA' and BB' in FIG. 1.
Figure 3:
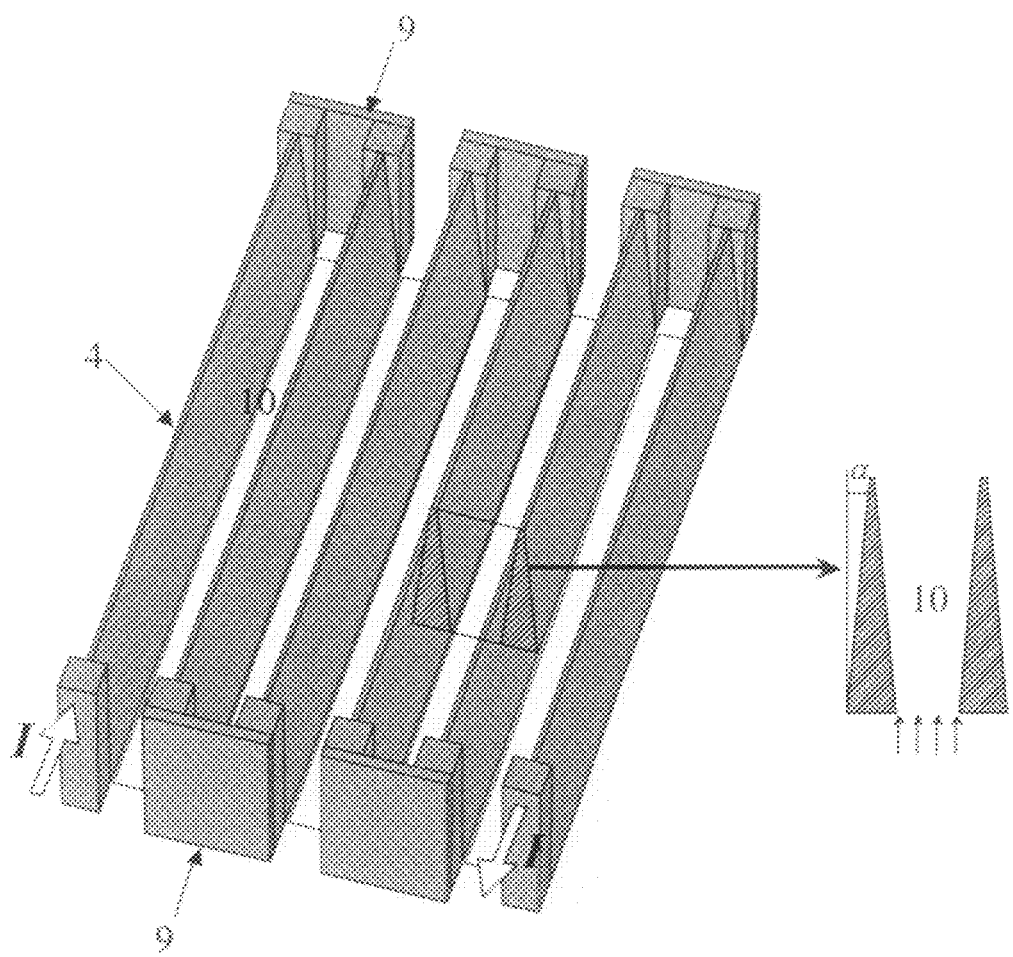
FIG. 3. Set of susceptors (4) for a 50 wafer prototype, which are interconnected by interconnection parts (9), of the same conductor material. Gas flows between them through the interduct (10), and molecules in the gas diffuse towards the susceptor surface, where the wafers are placed. Susceptors are slightly tilted with a trapezoidal section, as seen in the insert. An electrical current I is provided via the electrical feedthrough connection system represented in FIG. 4, and flows along all the susceptors while heating them by Joule effect.
Figure 4:
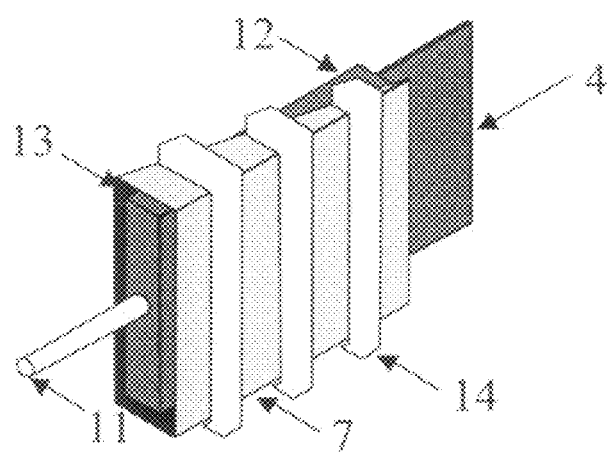
FIG. 4. The electrical feedthrough system designed to connect the hot susceptors (4) to the much colder electrical metallic feedthroughs (11) is represented, and consists of a thicker part of susceptor conductive material (12), for instance graphite, which is surrounded by a housing (7). The thicker graphite part irradiates energy easily, which is absorbed by the inner surface (13) of the housing (7), treated to be very radiation absorbent. External water cooling (14) of the housing, shown here as a set of metallic tubes of rectangular section, helps dissipate the heat absorbed by its inner walls (13). At the end of the thicker part (12), already colder, the connection to the metallic feedthroughs (11) can already be made safely.
Figure 5:
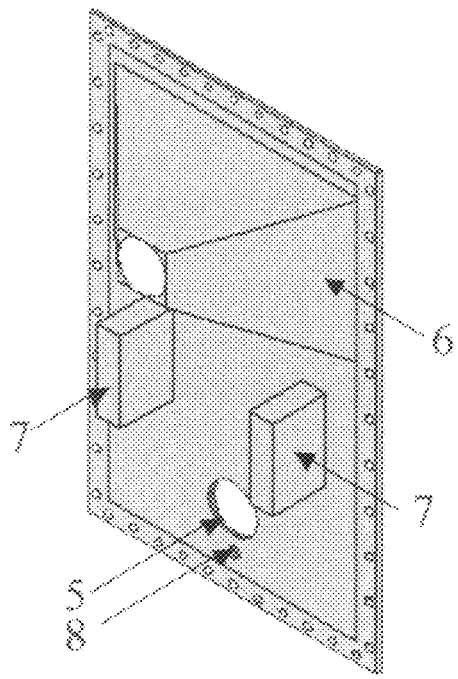
FIG. 5. Approximate scheme of the chamber connection panel. Gas inlet (5) and thermocouple and other feedthroughs (8) are situated in its lower part, coinciding with the positions inside. Above it, at the height of the susceptors, the panel is provided with the housings (7) for the electrical feedthrough systems described in FIG. 4, which connect to both extreme susceptors on the ends of the susceptor block represented in FIG. 3. Above the housings (7), the gas exits the reactor through the gas outlet (6), which is chimney shaped.
Figure 6:
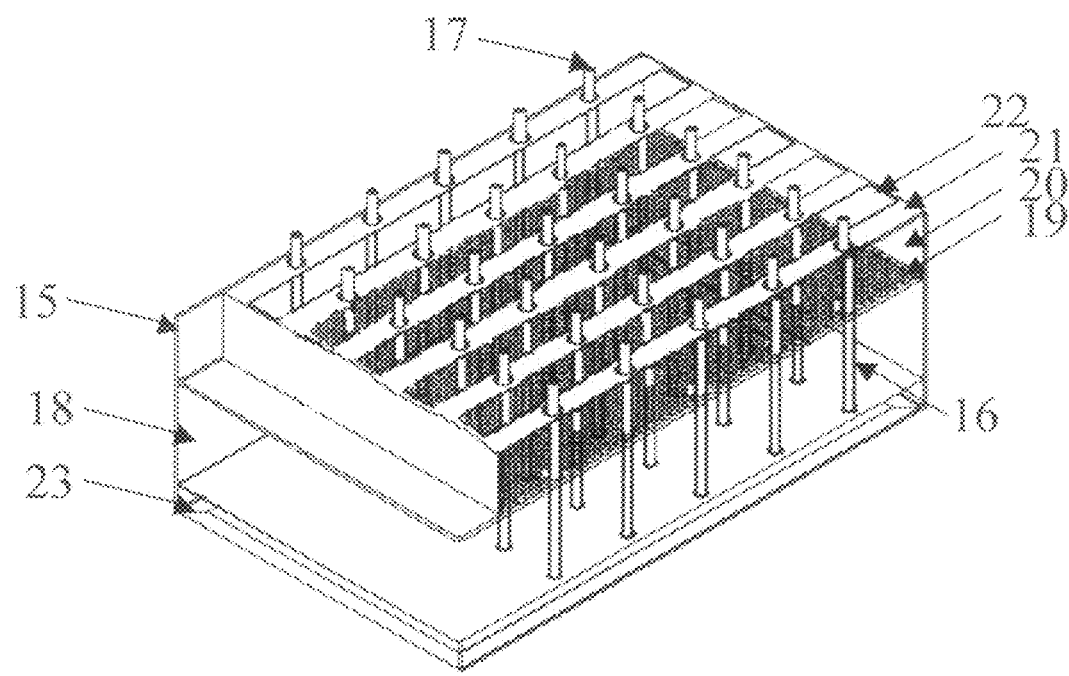
FIG. 6. Schematic view of the pre-chamber (3). The thermocouple chamber (23), flooded with an inert gas, is situated below, and collects all thermocouple wires coming from the susceptors through columns (17) from where they are led to the outer side through the wall via thermocouple feedthroughs. Gas enters the pre-chamber in its lower part (18), and flows upwards through the gas distributor (19), fills the upper part (20), and then flows through the upper wall (21) which is open (22) only to the interducts between susceptors. The pre-chamber is welded or attached to the reactor door at one edge (15).
Figure 7:
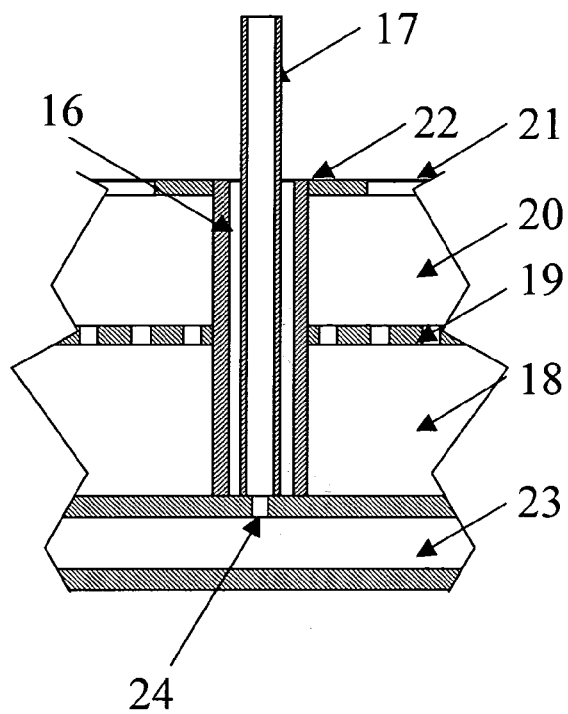
FIG. 7. Vertical cross-section across one of the hollow columns (16) that hold the pre-chamber structure, that also contain hollow ceramic tubes (17), on which susceptors stand, and through which thermocouples are led.
Figure 8:
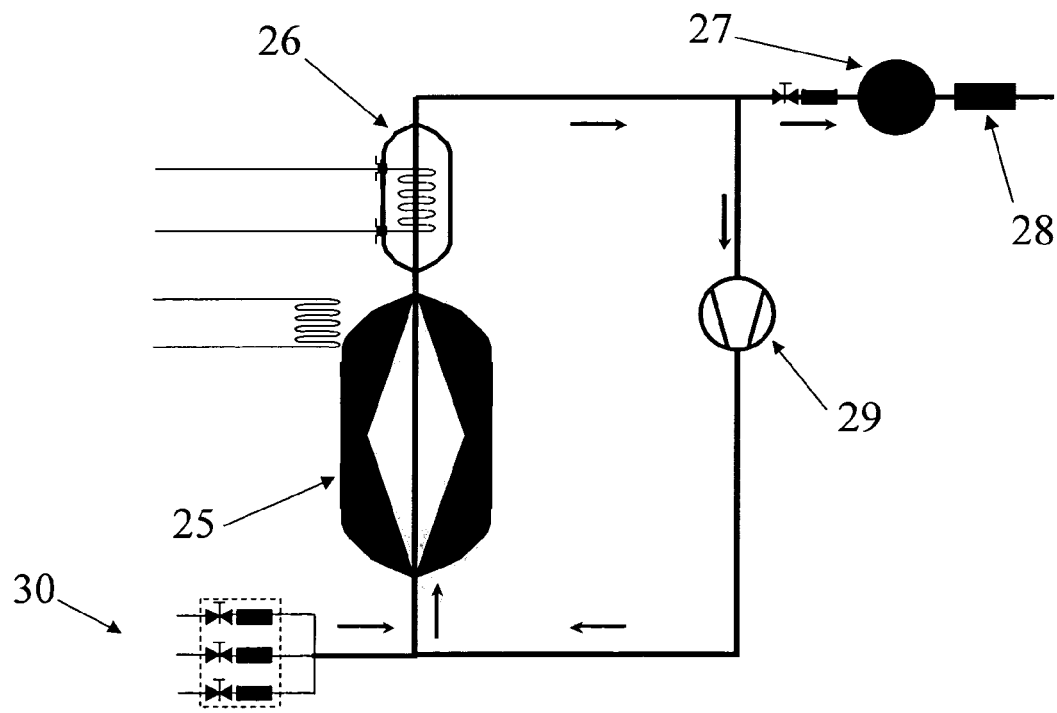
FIG. 8. Simple recycling system with no in situ source gas generation. Fresh gases (30) are fed to the reactor (25). They are heated during the process, needing to be cooled down at the outlet by means of a heat exchanger (26). Then, part of the gas stream is vented out by an extraction pump (28), going through a neutralizer (27). The rest of the stream is recycled by means of a blower (29), and is fed back to the reactor (25).
Figure 9:
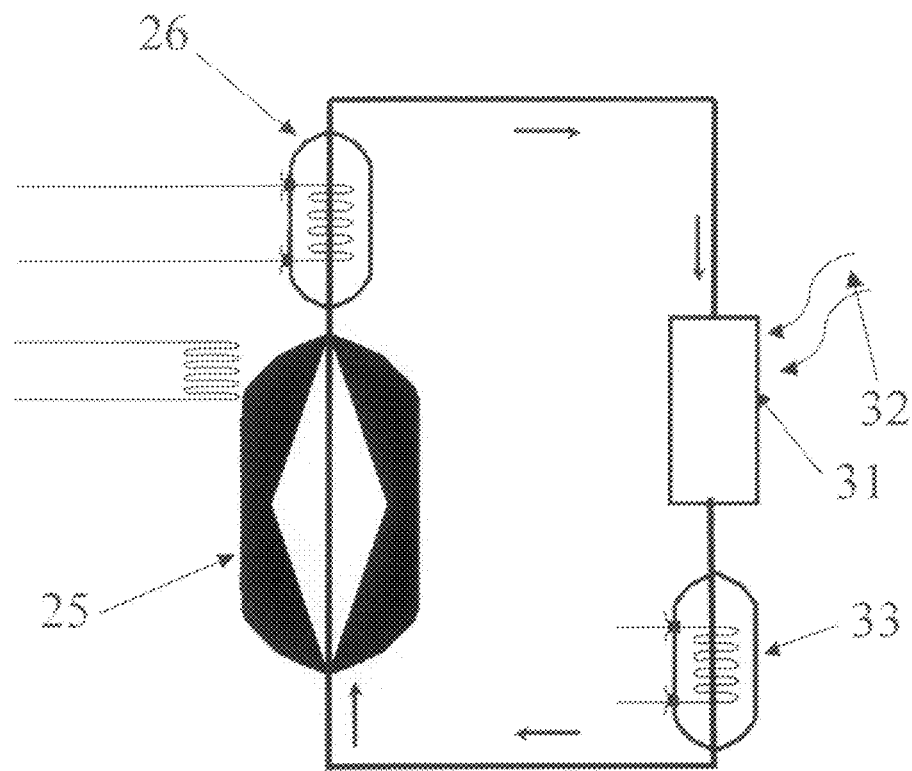
FIG. 9. Recycling system with in situ source gas generation. Initially, $H_2$ and HCl (32) are introduced in the etching chamber (31), where source silicon etching takes place. The outlet gas from this chamber is cooled by a heat exchanger (33) down to ambient temperature, and enters the epitaxial chamber (25), where epitaxial silicon deposition occurs. The outlet gas is cooled down by another heat exchanger (26), and is fed back again to the etching chamber (31). This way, a closed cycle is obtained, in which the only raw material is source silicon, and the only product, epitaxial silicon. Theoretical efficiency is 100%.
Figure 10:
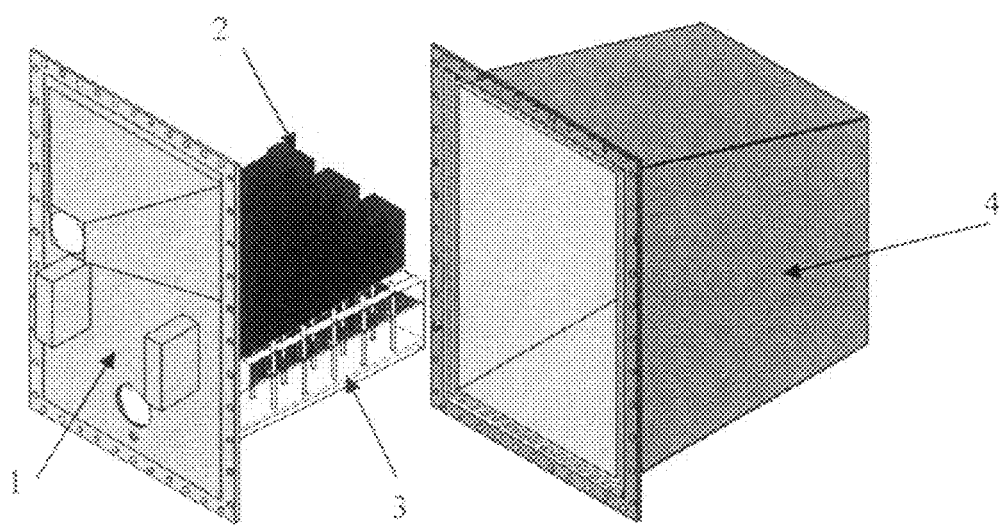
FIG. 10. Isometric view of the reactor ensemble, in an approximate scheme. The connection panel (1) (described in FIG. 5) is fix. Attached to it are the pre-chamber (3) (described in FIGS. 6 and 7), and the susceptors (4) (described in FIG. 2). Reactor walls (2), internally covered by reflective material, slide on rails to open and close the chamber.

The following example shows a mode of realization of the present invention:

Six susceptors are vertically placed, and parallel to one another, separated 4 cm, with 5 substrates per susceptor face, i.e., 50 substrates processes in total. They are heated by passing an electrical current through 4×1000 A feedthroughs. Susceptors are thus heated at 1000° C. for the deposition from trichlorosilane, and at 800° C. for that from silane. Between the six susceptors, a gas flow of approximately 1500 L/min is passed, which is achieved by recycling some 90% by means of a blower, and feeding a 10% of fresh gas. The same quantity is vented out by means of a pump. The gas flowing between susceptors is composed of a 99% of $H_2$ and a 1% of source gas. To that purpose, the ratio of source gas in the fresh gas stream is 10%.

A standard process may consist, after charging and closing, of a first vacuum step, followed by $N_2$ purge, then again vacuum and purge, with no recycling. Again in vacuum, susceptors are heated up to about 500° C., and a flow of 3-5% HCl in $H_2$ is passed in recycling mode, carrying out an in situ etching of the residual silicon deposited in previous processes. New steps of vacuum and purge are now followed by heating up to growth temperature, with no recycling. Then the growth gases in the appropriate ratio are fed, recycling. Once growth is finished, which takes between 10 and 15 minutes, and already with no electrical current through the susceptors, a cooling step under recycling is carried out, by passing a flow of about 2000 L/min of cold $H_2$, until temperature is below 200° C. After two more consecutive steps of vacuum and purge, opening and discharge can take place.

The invention claimed is:

1. Epitaxial reactor for the mass production of wafers, which comprises a tight chamber (25) with a tilted upper wall, externally water cooled and internally covered by reflective material, which is coupled to a gas recycling system and which contains a variable number of stacked, vertical and parallel susceptors (4), heated by Joule effect, and semiconductor plates on the susceptors held to them by pieces of their same material, and further comprises a housing (2) which slides on rails to open and close the chamber by uncoupling or coupling to a connection panel (1) said reactor including among its components: a fixed connection panel (1), where electrical (7) and thermocouple (8) connections, and gas inlet (5) and outlet (6) are found, together with a pre-chamber (3) fixed to the panel (1) where these electrical connections (7) connect very hot susceptors (4) to standard electrical feedthroughs that cannot stand high temperatures, with a temperature difference between them of greater than 600° C., and which comprise a thick, highly radiating prolongation (12) of the same conductive material as the susceptors (4), coupled to a housing coming out of the connection panel (1), with internal absorbent walls (13) and external water cooling (14), the pre-chamber (3) containing, on one hand, hollow columns (16) holding its structure, allocating hollow ceramic tubes (17) on which susceptors (4) stand, and thermocouples, whose cables are kept in an inert atmosphere until they reach the outer side, and containing, on the other hand, a gas distributor (19) to distribute the inlet gas throughout the space below the susceptors (4) in a laminar regime, and, finally, an upper wall (21) comprising or covered by reflective material that reflects the radiation emitted by the susceptors (4) placed just above the pre-chamber (3).

2. Epitaxial reactor for the mass production of wafers, according to claim 1, the susceptors (4) being parallelepiped with trapezoidal section, being wider in their base and thinner in their upper side, and connected to the fixed connection panel (1) by electrical connections (7).

3. Epitaxial reactor for the mass production of wafers, according to claim 1, wherein said gas recycling system extracts gases from the chamber (25) and re-injects them again totally or partially, and includes a heat exchanger (26) at the reactor gas outlet (6), an extraction pump (27) for a fraction of the gases, and a gas blower (29).

4. Epitaxial reactor for the mass production of wafers, according to claim 1, wherein said gas recycling system includes in situ formation of source gas by means of HCl etching of solid silicon, and includes a heat exchanger (26) at the outlet (6) of the chamber (25), a solid silicon etching chamber (31), another heat exchanger (33) at the outlet of this etching chamber (31), and initial gas feeding (32).

* * * * *